(12) United States Patent
Watanabe

(10) Patent No.: US 6,717,070 B2
(45) Date of Patent: Apr. 6, 2004

(54) PRINTED WIRING BOARD HAVING VIA AND METHOD OF MANUFACTURING THE SAME

(75) Inventor: Nagahisa Watanabe, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/899,156

(22) Filed: Jul. 6, 2001

(65) Prior Publication Data

US 2002/0023778 A1 Feb. 28, 2002

(30) Foreign Application Priority Data

Jul. 7, 2000 (JP) ........................................ 2000-207322

(51) Int. Cl.⁷ .......................... H05K 1/11; H01R 12/04
(52) U.S. Cl. ...................... 174/262; 174/258; 174/261; 174/266; 361/803
(58) Field of Search ........................ 174/250, 255, 174/258, 261, 262, 263, 264, 265, 266, 254; 361/792, 793, 794, 795, 803; 29/852, 830, 846

(56) References Cited

U.S. PATENT DOCUMENTS

| | | | | |
|---|---|---|---|---|
| 3,471,631 A | * | 10/1969 | Quintana | 174/264 |
| 3,725,743 A | * | 4/1973 | Murayama | 174/257 |
| 4,642,160 A | * | 2/1987 | Burgess | 216/18 |
| 5,108,553 A | * | 4/1992 | Foster et al. | 205/125 |
| 5,243,142 A | * | 9/1993 | Ishikawa et al. | 174/258 |
| 5,288,541 A | * | 2/1994 | Blackwell et al. | 428/209 |
| 5,347,712 A | * | 9/1994 | Yasuda et al. | 174/255 |
| 5,416,359 A | * | 5/1995 | Oda | 257/750 |
| 5,433,000 A | * | 7/1995 | Tamura et al. | 174/261 |
| 5,507,403 A | * | 4/1996 | Sakemura et al. | 216/18 |
| 5,544,773 A | * | 8/1996 | Haruta et al. | 216/13 |
| 5,747,358 A | * | 5/1998 | Gorrell et al. | 216/11 |
| 5,879,787 A | * | 3/1999 | Petefish | 174/256 |
| 6,000,130 A | * | 12/1999 | Chang et al. | 29/852 |
| 6,071,597 A | * | 6/2000 | Yang et al. | 174/254 |
| 6,162,365 A | * | 12/2000 | Bhatt et al. | 216/13 |
| 6,251,528 B1 | * | 6/2001 | Uzoh et al. | 428/587 |
| 6,405,431 B1 | * | 6/2002 | Shin et al. | 29/852 |
| 6,418,615 B1 | * | 7/2002 | Rokugawa et al. | 29/852 |
| 6,565,730 B2 | * | 5/2003 | Chakravorty et al. | 205/122 |

FOREIGN PATENT DOCUMENTS

| | | | |
|---|---|---|---|
| JP | 408186372 A | * | 7/1996 |
| JP | 411186731 A | * | 7/1999 |

\* cited by examiner

*Primary Examiner*—David A. Zarneke
*Assistant Examiner*—J B Patel
(74) *Attorney, Agent, or Firm*—Oblon, Spivak, McClelland, Maier & Neustadt, P.C.

(57) ABSTRACT

A printed wiring board comprises an insulating layer having first and second surfaces and the wiring layers. The insulating layer has a via electrically connected between the wiring layers. The via has one end opened on the first surface and the other end closed by the wiring layer on the second surface. The inner surface of the via is covered with a first plating layer. The first plating layer continuously covers the wiring layer exposed within the via and that portion of the wiring layer which is formed on the first surface and which faces one end of the via. A second plating layer is laminated on the first plating layer. The second plating layer electrically connects the wiring layers by cooperating with the first plating layer.

3 Claims, 9 Drawing Sheets

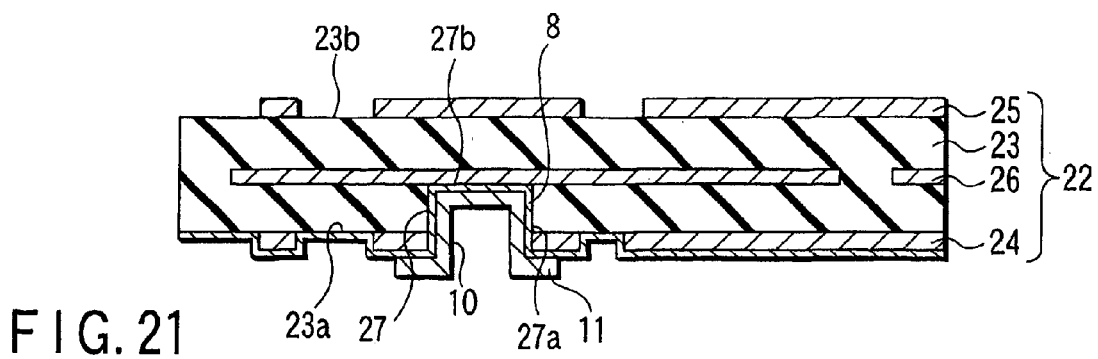
F I G. 21
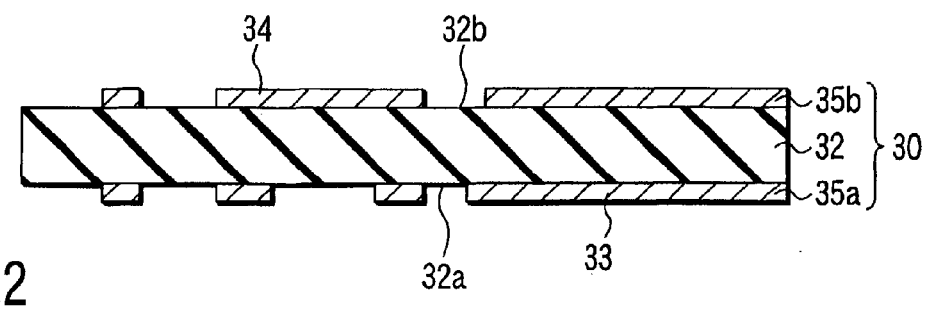
F I G. 22
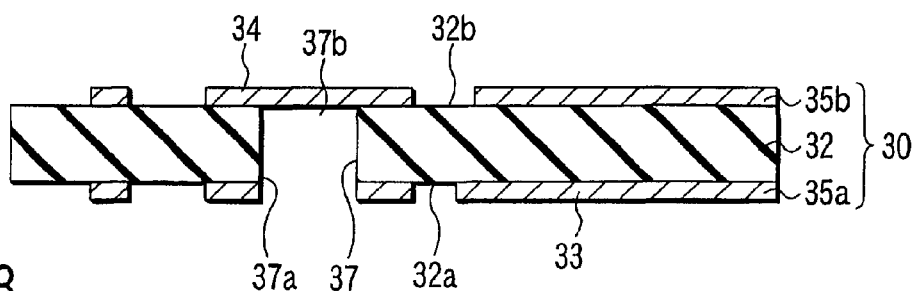
F I G. 23
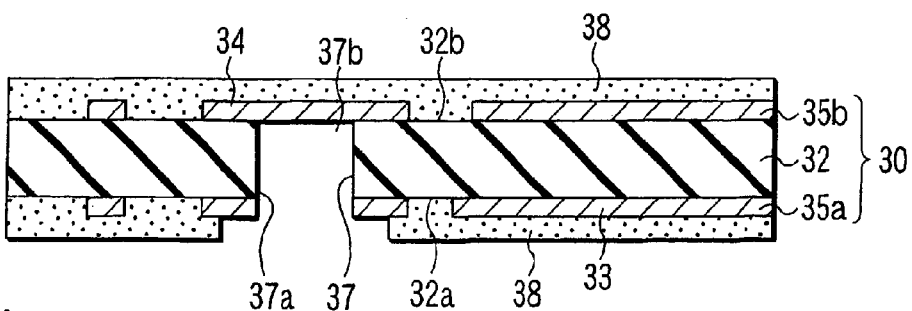
F I G. 24

PRINTED WIRING BOARD HAVING VIA AND METHOD OF MANUFACTURING THE SAME

CROSS-REFERENCE TO RELATED APPLICATIONS

This application is based upon and claims the benefit of priority from the prior Japanese Patent Application No. 2000-207322, filed Jul. 7, 2000, the entire contents of which are incorporated herein by reference.

BACKGROUND OF THE INVENTION

1. Field of the Invention

The present invention relates to a printed wiring board having a via for electrically connecting a plurality of wiring layers and a method of manufacturing printed wiring board.

2. Description of the Related Art

For example, a semiconductor package used for electronic apparatus such as a portable computer or the like is mounted on a printed wiring board. This printed wiring board has an insulating layer made of synthetic resin and a plurality of wiring layers. The insulating layer has a first surface and a second surface located on the opposite side of this first surface. The wiring layers are laminated on the first and second surfaces of the insulating layer, respectively. The wiring layers are formed so as to correspond to the predetermined circuit pattern, signal pins used for inputting and outputting for a semiconductor package and power source pins are electrically connected to these wiring layers.

Recently, as for a semiconductor package, the number of signal pins is much increased along with the higher packing density and higher performance, and there is increasing tendency to density of the signal pins. Therefore, for example, a wiring layer of a printed wiring board connected to a signal pin has to be arranged between pins arranged in a high density. As a result, a pattern width of a wiring layer itself becomes extremely narrow as well as a pitch of the wiring layer is finely divided.

On the other hand, this kind of printed wiring board has a via for electrically connecting a plurality of wiring layers which are separated by an insulating layer being interposed therebetween. This via is formed on the insulating layer in the steps of manufacturing a printed wiring board.

A conventional printed wiring board is manufactured according to the following procedure. First, a copper clad laminate is prepared. The copper clad laminate is a laminated layer in which copper foils are laminated on the first and second surfaces of the insulating layer, respectively. After this copper clad laminate is cut into a predetermined shape, a via is formed at a predetermined position of the copper clad laminate. A via is formed by applying a void processing to the insulating layer of the copper clad laminate, and has one end opened on the first surface of this insulating layer and the other end closed by the wiring layer on the second surface of the insulating layer.

When the via is formed on the copper clad laminate, electroless plating is applied to this copper clad laminate. By doing so, a first plating layer which is a groundwork for the conductivity is formed on the copper foil covering the first and second surfaces of the insulating layer and the inner surface of the via. Subsequently, an electrolytic plating is applied to the copper clad laminate, and a second plating layer is laminated on the first plating layer.

Next, the copper clad laminate is covered with an etching resist, and an etching processing is applied to this copper clad laminate. By doing so, the copper foil doubly covered with the first and second plating layers is selectively etched so that the copper foil is to be a fine circuit pattern. When the etching is completed, the etching resist is removed. By doing so, the wiring layers are formed on the first and second surfaces of the insulating layer, respectively. These wiring layers are maintained in a state where these are electrically connected through the first and second plating layers within the via.

However, according to a conventional method of manufacturing a printed wiring board, the first plating layer and the second plating layer are doubly adhered on the copper foil which is to be a wiring layer. Therefore, the thickness of the copper foil is exceeded by the portion of thickness of the first and second plating layers, and the thickness thereof may exceed the thickness limitation of the etching.

Specifically, a pattern width of a wiring layer obtained by etching relates to the thickness of this wiring layer, and usually, the minimum pattern width is made on the order of 10 to 20-fold of the thickness of the wiring layer. Therefore, as making a pitch and a pattern width of the wiring layer finer is pursued, as to the printed wiring board obtained by the above method of manufacture, the wiring layer itself becomes too thick with respect to the pattern width of the wiring layer. As a result, the etching becomes incomplete, the wiring layers adjacent to each other may develop a short circuit, and to make the wiring layer finer cannot be corresponded.

Moreover, a flexible printed wiring board in which a resin film of thermoplasticity is made as an insulating layer is often repeatedly bended or is mounted on electronic apparatus in a state of being bended in a U shape. Therefore, if the plating layers are doubly adhered on the copper foil positioned on the surface which is to be an internal side of the bending out of the flexible printed wiring board, particularly when the flexible printed wiring board is repeatedly bended, the plating layers may be released or a crack may be occurred. This released plating layer may interpose between the adjacent wiring layers and develop a short circuit in these wiring layers. Moreover, the missing of the plating layer causes the wiring layers themselves easily to be broken. Therefore, the reliability of the printed wiring board having the conventional fine wiring layers is low in the viewpoint of an electrical connection.

BRIEF SUMMARY OF THE INVENTION

An object of the present invention is to obtain a printed wiring board in which a wiring layer can be formed to be as thin as possible and can correspond to the tendency of making this wiring layer finer in an affordable way and a method of manufacturing the printed wiring board.

In order to achieve the object, a printed wiring board according to a first aspect of the present invention comprises an insulating layer having a first surface and a second surface located on the opposite side of the first surface; a plurality of wiring layers which are formed so as to correspond to a predetermined circuit pattern and formed by etching metal foils laminated on the first surface and the second surface of the insulating layer, respectively; a via which is formed on the insulating layer and has one end opened on the first surface of the insulating layer and the other end closed by the wiring layer on the second surface of the insulating layer; a first plating layer which continuously covers the inner surface of the via and the wiring layer on the second surface exposed within the via and that portion of the wiring layer which is formed on the first surface and which faces one end of the via; and a second plating layer which is laminated on the first plating layer and electrically connects the wiring layer located on the first surface and the wiring layer located on the second layer by cooperating with this first plating layer.

Moreover, in order to achieve the object, a printed wiring board according to a second aspect of the present invention comprises a laminate which includes an insulating layer having a first surface and a second surface located on the opposite side of the first surface, and a plurality of wiring layers laminated on the first surface and the second surface of the insulating layer and inside of the insulating layer, these wiring layer being formed so as to correspond to a predetermined circuit pattern; a via which is formed on the laminate and has one end opened on the first surface of the insulating layer and the other end closed by the wiring layer inside of the insulating layer; a first plating layer which continuously covers the inner surface of the via and the wiring layer inside of the insulating layer exposed within the via and that portion of the wiring layer which is formed on the first surface and which faces one end of the via; and a second plating layer which is laminated on the first plating layer and electrically connects the wiring layer located on the first surface and the wiring layer inside of the insulating layer by cooperating with the first plating layer.

According to such a configuration, since the first and second plating layers are formed on a portion of the via spanning between the wiring layers, there is no possibility such that the first and second plating layers remain or adhere to the wiring layers. Therefore, the wiring layer can be thinned thereby easily making a pitch and a pattern width of these wiring layers finer.

Moreover, in the case where the insulating layer is made, for example, of a flexible material such as a resin film or the like, the following advantage exists: since the first and second plating layers are not necessary to be laminated on the wiring layers, by employing a rolled copper foil as a metal foil configuring this wiring layer, even if the bending force is repeatedly added to the printed wiring board or even if it is the usage form such that it is bended in a U shape, a break of the wiring layers due to the missing of the plating layers can be prevented. Therefore, the reliability of electrical connection is enhanced as well as the life of the printed wiring board becomes longer.

In order to achieve the object, a method according to the first aspect of the present invention is applied to a printed wiring board including an insulating layer having a first surface and a second surface located on the opposite side of the first surface and a plurality of wiring layers formed so as to correspond to a predetermined circuit pattern, the method comprises: a first step in which the wiring layers are formed on the first and second surfaces of the insulating layer, respectively; a second step in which a via whose one end is opened on the first surface and the other end of which is closed by the wiring layer located on the second surface is formed on the insulating layer; a third step in which a first plating resist covers the second surface of the insulating layer and the wiring layer formed on the second surface; a fourth step in which a first plating layer continuously covers the inner surface of the via, the wiring layer located on the second surface exposed within the via and the wiring layer located on the first surface; a fifth step in which a second plating resist covers a region other than a portion on which one end of the via is opened out of the first surface of the insulating layer as well as the wiring layer located on the first surface; a sixth step in which a second plating layer is laminated on the first plating layer, the wiring layer located on the first surface and the wiring layer located on the second surface are electrically connected through the first and second plating layers; a seventh step in which after electrical connection is completed between the wiring layers, the first and second plating resists are removed; and an eighth step in which the first plating layer exposed on the first surface of the insulating layer is removed along with the removal of the second plating resist.

Moreover, in order to achieve the object, a method of manufacturing a printed wiring board according to the second aspect of the present invention comprises: a fist step in which a laminate including an insulating layer and a plurality of wiring layers is obtained, the insulating layer having a first surface and a second surface located on the opposite side of the first surface, and the plurality of wiring layers being arranged on the first and second surfaces of the insulating layer and inside thereof so as to correspond to a predetermined circuit pattern; a second step in which a via whose one end is opened on the first surface of the insulating layer and the other end of which is closed by the wiring layer inside of the insulating layer is formed on the laminate; a third step in which a first plating resist covers the second surface of the insulating layer and the wiring layer laminated on the second surface; a fourth step in which a first plating layer continuously covers the inner surface of the via, the wiring layer inside of the insulating layer exposed within the via and the wiring layer located on the first surface of the insulating layer; a fifth step in which a second plating resist covers a region other than a portion on which the one end of the via is opened out of the first surface of the insulating layer as well as the wiring layer located on this first surface; a sixth step in which a second plating layer is laminated on the first plating layer, the wiring layer located on the first surface and the wiring layer inside of the insulating layer are electrically connected through the first and second plating layers; a seventh step in which after an electrical connection is completed between the wiring layers, the first and second plating resists are removed; and an eighth step in which the first plating layer exposed on the first surface of the insulating layer is removed along with the removal of the second plating resist.

According to such a method of manufacture, at the time when the first and second plating layers are formed on the inner surface of the via, the second surface of the insulating layer having wiring layer is covered with the first plating resist. Therefore, the first and the second plating layers are not doubly adhered to the wiring layer located on the second surface. Accompanying with it, the other end of the via is closed by the wiring layer. Therefore, the first and second plating layers remain inside of the via and not exposed on the second surface of the insulating layer.

Moreover, at the time when the second plating layer is formed on the inner surface of the via, most of the first surface of the insulating layer other than a portion corresponding to one end of the via is covered with the second plating resist. Therefore, the second plating layer is not adhered to the wiring layer located on the first surface. In addition, since the first plating layer located on the first surface is removed in the final step, the first plating layer does not remain as it is adhered to the wiring layer located on the first surface.

Therefore, the wiring layers located on the first and second surfaces of the insulating layer can be made thinner and a pitch and a pattern width of these wiring layers are easily made finer.

Moreover, in the case where the insulating layer is made, for example, of a flexible material such as a resin film or the like, the following advantage exists: since the first and second plating layers are not necessary to be laminated on the wiring layers, by employing a rolled copper foil as a metal foil configuring this wiring layer, even if the bending force is repeatedly added to the printed wiring board or even if it is the usage form such that it is bended in a U shape, a break of the wiring layers due to the missing of the plating layers can be prevented. Therefore, the reliability of electrical connection is enhanced as well as the life of the printed wiring board becomes longer.

In order to achieve the object, a method of manufacture according to a third aspect of the present invention is applied to a printed wiring board including an insulating layer having a first surface and a second surface located on the opposite side of the first surface and a plurality of wiring layers formed so as to correspond to a predetermined circuit pattern, the method comprises: a first step in which the wiring layers are formed on the first and second surfaces of the insulating layer, respectively; a second step in which a via whose one end is opened on the first surface and the other end of which is closed by the wiring layer located on the second surface is formed; a third step in which a plating resist covers the second surface of the insulating layer and a region other than a portion on which one end of the via out of the first surface of the insulating layer as well as the wiring layers located on the first and second surfaces; a fourth step in which a first plating layer continuously covers the inner surface of the via, the wiring layer located on the second surface exposed within the via and that portion of the wiring layer which is formed on the first surface of the insulating layer and which is other than the plating resist; a fifth step in which a second plating layer is laminated on the first plating layer and the wiring layer located on the first surface and the wiring layer located on the second surface are electrically connected through the first and second plating layers; and a sixth step in which after an electrical connection is completed between the wiring layers, the plating resists are removed.

In order to achieve the object, a method of manufacturing a printed wiring board according to a fourth aspect of the present invention comprises: a first step in which a laminate including an insulating layer and a plurality of wiring layers is obtained, the insulating layer having a first surface and a second surface located on the opposite side of the first surface, and the plurality of wiring layers being arranged on the first and second surfaces of the insulating layer and inside thereof so as to correspond to a predetermined circuit pattern; a second step in which a via whose one end is opened on the first surface of the insulating layer and the other end of which is closed by the wiring layer inside of the insulating layer is formed on the laminate; a third step in which a first plating resist covers the second surface of the insulating layer and a region other than a portion on which one end of the via is opened out of the first surface of the insulating layer as well as the wiring layers located on these first and second surfaces; a fourth step in which a first plating layer continuously covers the inner surface of the via, the wiring layer inside of the insulating layer exposed within the via and a portion where the plating resist comes out of the wiring layer located on the first surface; a fifth step in which a second plating layer is laminated on the first plating layer, the wiring layer located on the first surface and the wiring layer inside of the insulating layer are electrically connected through the first and second plating layers; and a sixth step in which after an electrical connection is completed between the wiring layers, the plating resists are removed.

According to such a method of manufacture, at the time when the first and second plating layers are formed on the inner surface of the via, the first and second surfaces of the insulating layer as well as the wiring layers located on these surfaces are covered with the plating resist. Therefore, the first and the second plating layers are not doubly adhered to the wiring layers located on the first and second surfaces. Moreover, the other end of the via is closed by the wiring layer. Therefore, the first and second plating layers remain inside of the via and not exposed on the second surface of the insulating layer.

Therefore, the wiring layers located on the first and second surfaces of the insulating layer can be made thinner and a pitch and a pattern width of these wiring layers are easily made finer.

Moreover, in the case where the insulating layer is made, for example, of a flexible material such as a resin film or the like, the following advantage exists: since the first and second plating layers are not necessary to be laminated on the wiring layers, by employing a rolled steel plate as a metal foil configuring this wiring layer, even if the bending force is repeatedly added to the printed wiring board or even if it is the usage form such that it is bended in a U shape, a break of the wiring layers due to the missing of the plating layers can be prevented. Therefore, the reliability of electrical connection is enhanced as well as the life of the printed wiring board becomes longer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 21 is a sectional view of a laminate showing a state where an electroless plating resist is removed in the third embodiment of the present invention;

FIG. 22 is a sectional view of a copper clad laminate of a fourth embodiment of the present invention having an insulating layer and the wiring layers laminated on the first and second surfaces of this insulating layer;

FIG. 23 is a sectional view of a copper clad laminate showing a state where a via is formed on an insulating layer in the fourth embodiment of the present invention;

FIG. 24 is a sectional view of a copper clad laminate showing a state where the first and second surfaces of an insulating layer are covered with a plating resist together with a wiring layer in the fourth embodiment of the present invention;

DETAILED DESCRIPTION OF THE INVENTION

Hereinafter, the first embodiment of the present invention will be described with reference to FIGS. 1 to 9.

Figure 1:
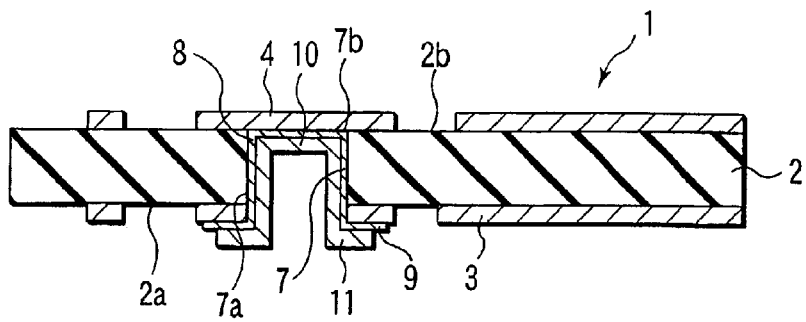
FIG. 1 is a sectional view of a printed wiring board of the first embodiment of the present invention.

FIG. 1 shows a hard printed wiring board 1 used for electronic apparatus such as a portable computer. This printed wiring board 1 comprises an insulating layer 2 as a base and wiring layers 3 and 4 as a printing conductor.

The insulating layer 2 has the form of a flat plate shape made of a synthetic resin material. This insulating layer 2 has a first surface 2a and a second surface 2b located on the opposite side of this first surface 2b. The wiring layer 3 is laminated on the first surface 2a of the insulating layer 2. The wiring layer 4 is laminated on the second surface 2b of the insulating layer 2. These wiring layers 3 and 4 are made of copper foil having a section in a rectangular shape and formed so as to correspond to a predetermined circuit pattern on the first and second surfaces 2a and 2b.

The insulating layer 2 has a via 7 for electrically connecting the wiring layers 3 and 4. The via 7 penetrates the insulating layer 2 in the direction of the thickness. The via 7 has one end 7a and the other end 7b located on the opposite side of the one end 7a. The one end 7a of the via 7 is opened on the first surface 2a in a position other than the wiring layer 3 on the first surface 2a of the insulating layer 2. The other end 7b of the via 7 reaches the wiring layer 4 of the second surface 2b of the insulating layer 2. The other end 7b of the via 7 is not opened on the second surface 2b of the insulating layer 2 and closed by the wiring layer 4 formed on the second surface 2b. Therefore, the wiring layer 4 has a rear surface exposed within the via 7 and the rear surface faces the one end 7a of the via 7.

The inner surface of the via 7 is covered with a first plating layer 8. The first plating layer 8 functions as a groundwork for conductivity. The first plating layer 8 continuously covers the rear surface of the wiring layer 4 exposed within the via 7. The first plating layer 8 has a flange portion 9 extending to the first surface 2a of the insulating layer 2 from the one end 7a of the via 7. The flange portion 9 covers a portion continuing to the one end 7a of the via 7 out of the wiring layer 3.

The first plating layer 8 is covered with a second plating layer 10. The second plating layer 10 has a flange portion 11 extending to the first surface 2a of the insulating layer 2 from the one end 7a of the via 7. The flange portion 11 is laminated on the flange portion 9 of the first plating layer 8. Therefore, the wiring layers 3 and 4 separated by sandwiching the insulating layer 2 are electrically connected to each other through the first and second plating layers 8 and 10 existing inside of the via 7.

Next, the procedure for manufacturing the printed wiring board 1 of the above configuration will be described with reference to FIGS. 2 to 9.

Figure 2:
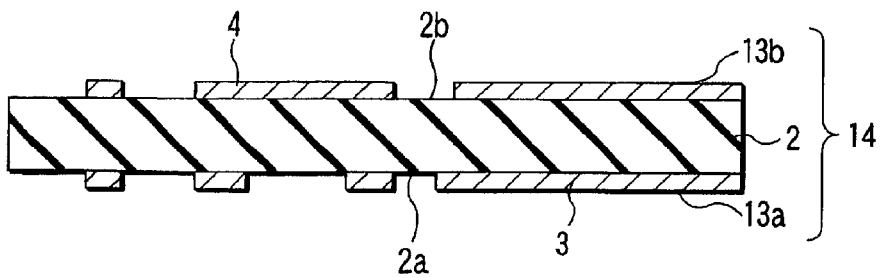
FIG. 2 is a sectional view of a copper clad laminate of the first embodiment of the present invention having an insulating layer and the wiring layers laminated on the first and second surfaces of this insulating layer.

First, a copper clad laminate 14 is prepared. The copper clad laminate 14 is constituted of the insulating layer 2 and copper foils 13a and 13b which are laminated on the first and second surfaces 2a and 2b of the insulating layer 2. The copper clad laminate 14 is cut into the size corresponding to the printed wiring board 1. Following this cut, if an etching resist is coated on the copper clad laminate 14, the etching processing is carried out on the copper clad laminate 14. The copper foils 13a and 13b are etched, the wiring layers 3 and 4 are formed as shown in FIG. 2 on the first and second surfaces 2a and 2b of the insulating layer 2.

Figure 3:
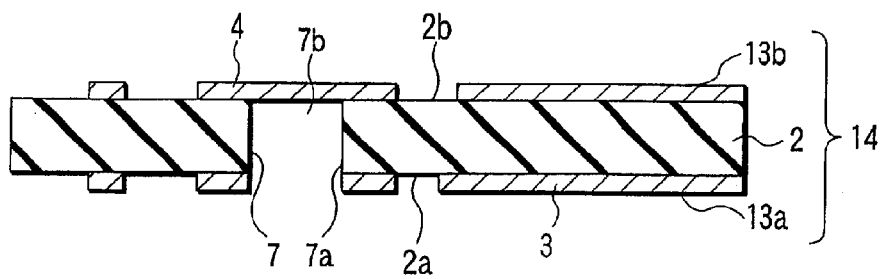
FIG. 3 is a sectional view of a copper clad laminate showing a state where a via is formed on an insulating layer in the first embodiment of the present invention.

Next, The via 7 as shown in FIG. 3 is formed by applying a laser processing to the copper clad laminate 14. A laser used for laser processing is irradiated on a portion other than the wiring layer 3 out of the first surface 2a of the insulating layer 2, and scrapes off along the direction of the thickness of this insulating layer 2. This laser irradiation is stopped at the time when the other end 7b of the via 7 reaches the wiring layer 4 of the second surface 2 of the insulating layer 2. As a result, the one end 7a of the via 7 is opened on the first surface 2a of the insulating layer 2 as well as the rear surface of the wiring layer 4 is exposed to the inside of the via 7.

Figure 4:
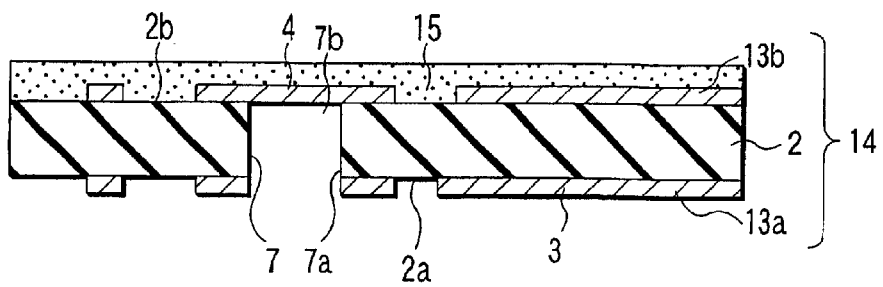
FIG. 4 is a sectional view of a copper clad laminate showing a state where an electroless plating resist is coated on the second surface of the insulating layer in the first embodiment of the present invention.

Next, as shown in FIG. 4, an electroless plating resist (a first plating resist) 15 is coated on the second surface 2b of the insulating layer 2. The electroless plating resist 15 covers the second surface 2b of the insulating layer 2 and the wiring layer 4 on the second surface 2b.

Figure 5:
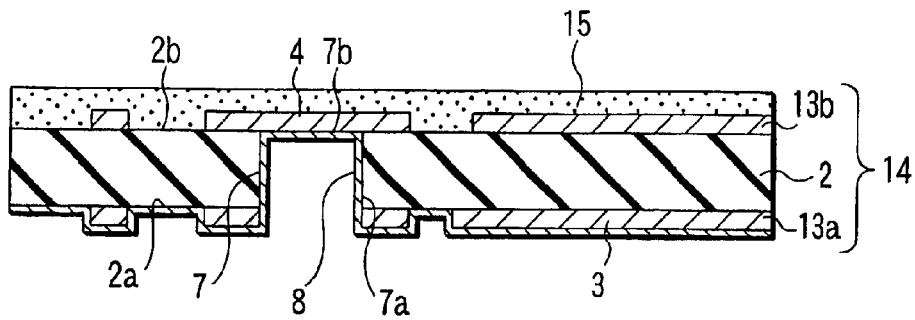
FIG. 5 is a sectional view of a copper clad laminate showing a state where the first plating layer is formed on the first surface of the insulating layer and the inner surface of the via in the first embodiment of the present invention.

Next, an electroless plating is applied on the copper clad laminate 14. By doing so, out of the copper clad laminate 14, at a portion exposed without being covered with the electroless plating resist 15, concretely, on the first surface 2a of the insulating layer 2 having the wiring layer 3, and the inner surface of the via 7, and the rear surface of the wiring layer 4 exposed within the via 7, the first plating layer 8 is continuously formed as shown in FIG. 5.

Figure 6:
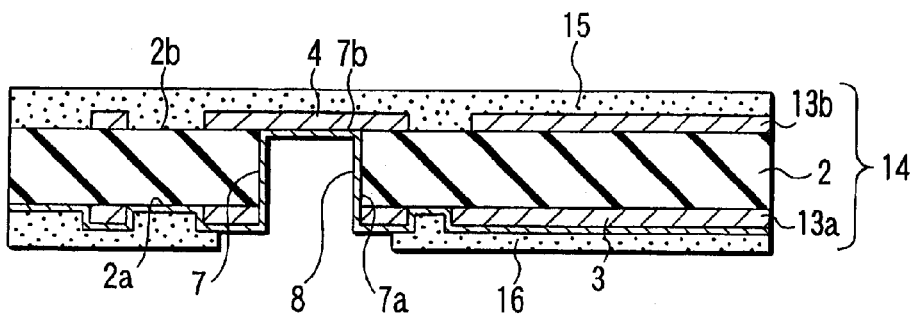
FIG. 6 is a sectional view of a copper clad laminate showing a state where an electrolytic plating resist is coated on the first plating layer in the first embodiment of the present invention.

Next, as shown in FIG. 6, a region other than a portion enclosing the one end 7a of the via 7 out of the first surface 2a of the insulating layer 2 covered with the first plating layer 8 is coated with an electrolytic plating resist (a second plating resist) 16. As a result, the copper clad laminate 14 is covered with the first and second plating resists 15 and 16 at a portion other than the via 7 and the periphery of the one end 7a of the via 7, and maintained in a state where only the first plating layer 8 positioned on the inner surface of the via 7 and on the periphery of the one end 7a is exposed to the outside of the copper clad laminate 14.

Figure 7:
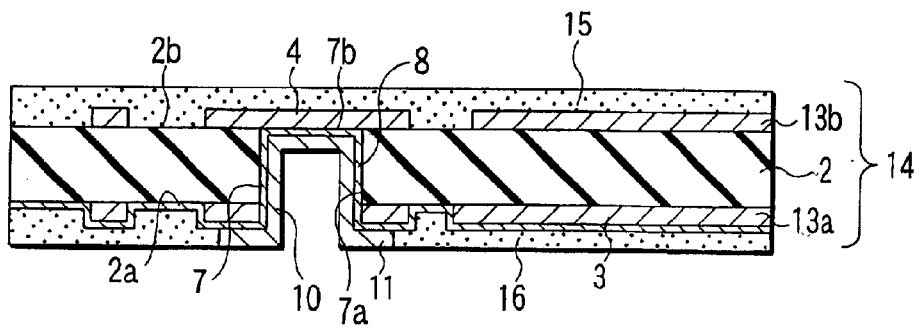
FIG. 7 is a sectional view of a copper clad laminate showing a state where the second plating layer is laminated on the first plating layer in the first embodiment of the present invention.

Next, an electrolytic plating is applied on the copper clad laminate 14. By doing so, as seen in FIG. 7, the second plating layer 10 is laminated on a portion covering the inner surface of the via 7 out of the first plating layer 8. Moreover, a portion enclosing the one end 7a of the via 7 out of the first plating layer 8 is not covered with the electrolytic plating resist 16, and exposed to the outside of the copper clad laminate 14. Therefore, the second plating layer 10 continuously adheres, this portion functions as the flange portion 11 superimposing on the wiring layer 3.

Figure 8:
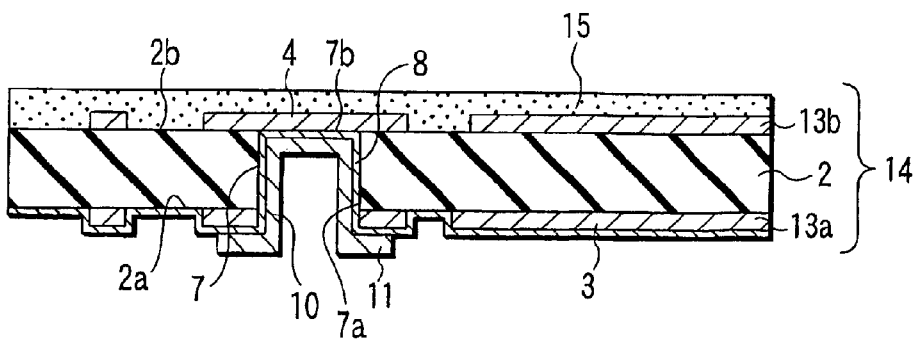
FIG. 8 is a sectional view of a copper clad laminate showing a state where an electrolytic plating resist is removed in the first embodiment of the present invention.
Figure 9:
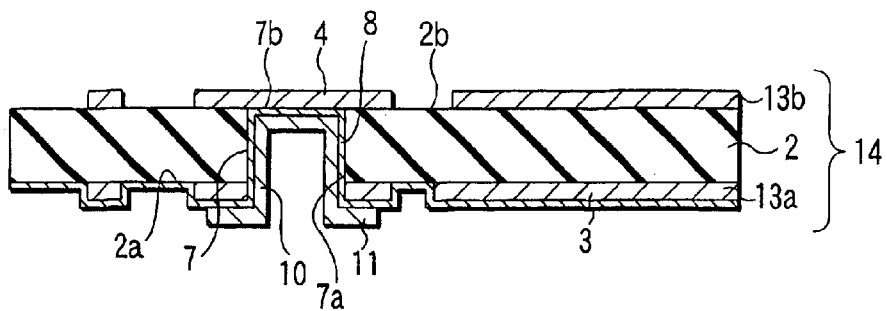
FIG. 9 is a sectional view of a copper clad laminate showing a state where an electroless plating resist is removed in the first embodiment of the present invention.

Next, as seen in FIG. 8 and FIG. 9, the electroless plating resist 15 of the second surface 2b of the insulating layer 2 is removed as well as the electrolytic plating resist 16 of the first surface 2a of the insulating layer 2 is removed. By doing so, the wiring layer 4 and the wiring layer 3 covered with the first plating layer 8 are exposed.

Finally, etching is lightly applied on the copper clad laminate 14, and the first plating layer 8 on the wiring layer 3 is removed.

By passing such a series of steps, the first and second plating layers 8 and 10 are formed as they encloses the inner surface of the via 7 and the one end 7a of the via 7, and the printed wiring board 1 to which the wiring layers 3 and 4 are electrically connected through the plating layers 8 and 10 is obtained.

According to the first embodiment of the present invention, the wiring layers 3 and 4 are formed on the capper clad laminate 14 earlier than the via 7. Therefore, at the time when the electroless plating and the electrolytic plating are applied on the portion of the via 7, the second surface 2b of the insulating layer 2 has been already covered with the electroless plating resist 15. As a result, the first and second plating layers 8 and 10 are not doubly adhered to the wiring layer 4 of the second surface 2b, the wiring layer 4 is constituted of only the copper foil 13b.

Moreover, at the time when the electrolytic plating is applied on a portion of the via 7 subsequently following the electroless plating, the first surface 2a of the insulating layer 2 is also covered with the electrolytic plating resist 16. Therefore, after the electroless plating resist 15 and the electrolytic plating resist 16 are removed from the copper clad laminate 14, the first plating layer 8 on the first surface 2a can be easily removed only by applying an etching to the copper clad laminate 14. Therefore, it is not happened that the first plating layer 8 remains adhered to the wiring layer 3 of the first surface 2a, the wiring layer 3 is constituted of only the copper foil 13a.

In addition, since the other end 7b of the via 7 is closed by the wiring layer 4 formed on the second surface 2b of the insulating layer 2, the first and second plating layers 8 and 10 electrically connecting the wiring layers 3 and 4 are not exposed to the second surface 2b of the insulating layer 2.

Therefore, the first and second plating layers 8 and 10 exist only in a portion of the via 7, although the plating processing has been applied on the copper clad laminate 14, the excess plating is not adhered to the copper foils 13a and 13b constituting the wiring layer 3 and 4. Therefore, the wiring layers 3 and 4 can be made thinner, and a pitch and a pattern width of the wiring layers 3 and 4 are easily made to be finer. Hence, it has an advantage that it can easily correspond to the higher density of the wiring layers 3 and 4.

Figure 10:
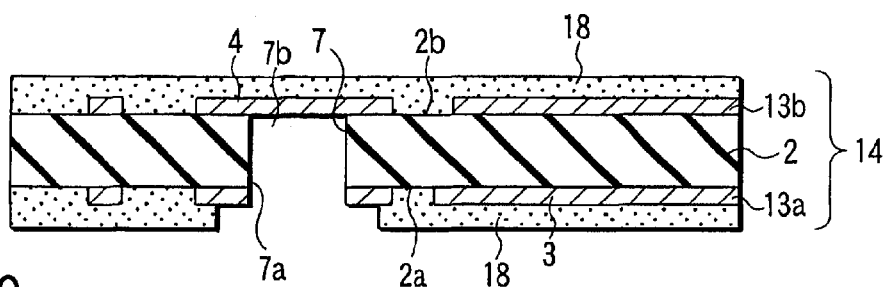
FIG. 10 is a sectional view of a copper clad laminate showing a state where the first and second surfaces of the insulating layer are covered with a plating resist together with a wiring layer in a second embodiment of the present invention.
Figure 11:
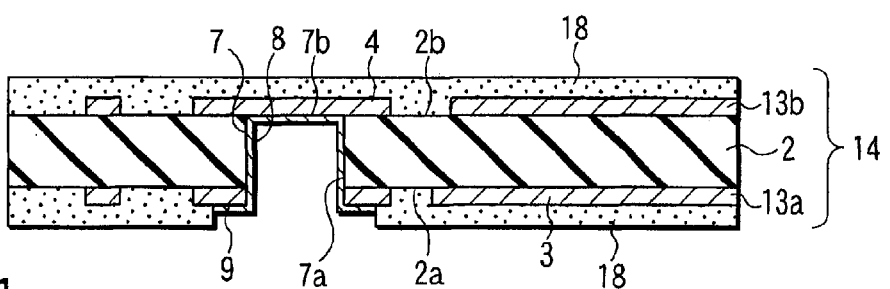
FIG. 11 is a sectional view of copper clad laminate showing a state where the first plating layer is formed on the inner surface of the via in the second embodiment of the present invention.
Figure 12:
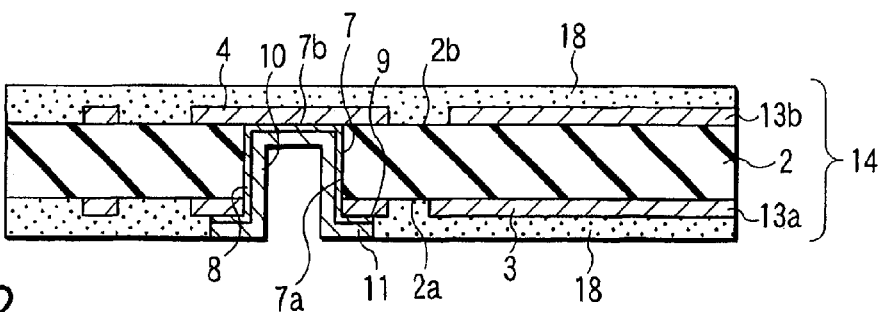
FIG. 12 is a sectional view of a copper clad laminate showing a state where the second plating layer is laminated on the first plating layer in the second embodiment of the present invention.

It should be noted that the present invention is not limited to the first embodiment, the second embodiment of the present invention is shown in FIGS. 10 to 12. As for this second embodiment, the manufacturing steps of the printed wiring board 1 after the via 7 is formed is different from the steps of the first embodiment.

As shown in FIG. 10, when the via 7 is formed on the copper clad laminate 14, a plating resist 18 is coated on the first and second surfaces 2a and 2b of the insulating layer 2, respectively. The plating resist 18 covers a region other than a portion enclosing the one end 7a of the via 7 out of the first surface 2a along with the wiring layer 3 as well as it entirely covers the second surface 2b of the insulating layer 2 and the wiring layer 4 formed on this second surface 2b.

Next, an electroless plating is applied on the copper clad laminate 14 which is covered with the plating resist 18. By doing so, at a portion exposed to the outside without being covered with the plating resist 18 out of he copper clad laminate 14, concretely, on the rear surface of the wiring layer 4 closing the other end 7b of the via 7 and the inner surface of the via 7, the first plating layer 8 as a conductive substrate as shown in FIG. 11 is continuously formed.

Moreover, a portion enclosing the one end 7a of the via 7 out of the first surface 2a of the insulating layer 2 is exposed to the outside without being covered with the plating resist 18. Therefore, the first plating layer 8 is also continuously adhered here, and this portion functions as the flange portion 9.

Subsequently, an electrolytic plating is applied on the copper clad laminate 14 covered with the plating resist 18. By doing so, as seen in FIG. 12, the second plating layer 10 is laminated on the first plating layer 8. This second plating layer 10 has the flange portion 11 extending to the wiring layer 3 adjacent to the via 7 as in a spanning way. The flange portion 11 is laminated on the flange portion 9 of the first plating layer 8.

Finally, the plating resist 18 is removed from the copper clad laminate 14, and the wiring layers 3 and 4 are exposed. By passing such a series of steps, the first and second plating layers 8 and 10 are formed so as to enclose the inner surface of the via 7 and the one end 7a of the via 7, the printed wiring board 1 to which the wiring layers 3 and 4 are electrically connected through the plating layers 8 and 10 is obtained.

Thus, according to the second embodiment of the present invention, at the time when an electroless plating or an electrolytic plating is applied on the via 7, the wiring layers 3 and 4 are covered with the plating resist 18. Therefore, the excess of plating is not adhered to the copper foils 13a and 13b constituting the wiring layers 3 and 4, and these wiring layers 3 and 4 can be made thinner. Hence, a pitch and pattern width of the wiring layers 3 and 4 can be made to be finer, thereby realizing the higher density of the wiring layers 3 and 4.

FIGS. 13 to 21 show the third embodiment of the present invention.

In the third embodiment, the present invention is applied to a multilayer printed wiring board 21. In this third embodiment, the same reference numerals are attached to the identical constituents with those of the first embodiment and description thereof will be omitted.

Figure 13:
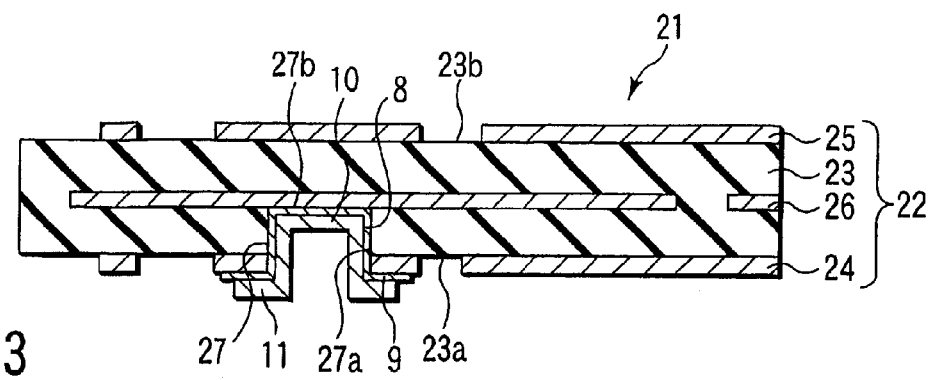
FIG. 13 is a sectional view of a multilayer printed wiring board of a third embodiment of the present invention.
Figure 14:
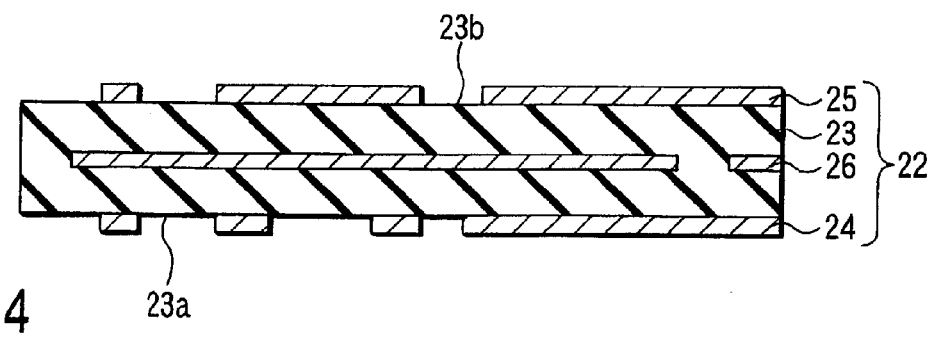
FIG. 14 is a sectional view of a laminate having the first to third wiring layer in the third embodiment of the present invention.

FIG. 13 shows the hard multilayer printed wiring board 21. This multilayer printed wiring board 21 comprises a laminate 22. The laminate 22 includes an insulating layer 23 and first to third wiring layers 24, 25 and 26. The insulating layer 23 has a first surface 23a and a second surface 23b located on the opposite side of the first surface 23a. The first wiring layer 24 is laminated on the first surface 23a of the insulating layer 23 and the second wiring layer 25 is laminated on the second surface 23b of the insulating layer 23. The third wiring layer 26 is positioned inside of the insulating layer 23. Therefore, the first to third wiring layers 24 through 26 are laminated by interposing the insulating layer 23 therebetween.

The laminate 22 has a via 27. The via 27 is for electrically connecting the first wiring layer 24 formed on the first surface 23a and the third wiring layer 26 inside of the insulating layer 23. The via 27 has one end 27a and the other end 27b located on the opposite side of the one end 27a. The one end 27a of the via 27 is opened on the first surface 23a of the insulating layer 23 at a position other than the first wiring layer 24. The other end 27b of the via 27 reaches the third wiring layer 26 inside of the insulating layer 23, and is closed by the third wiring layer 26. Therefore, the third wiring layer 26 has the rear surface exposed within the via 27, the rear surface faces the one end 27a of the via 27.

The inner surface of the via 27 is covered with the first plating layer 8. The first plating layer 8 continuously covers the rear surface of the third wiring layer 26 exposed within the via 27. Moreover, the first plating layer 8 has the flange portion 9 extending to the first surface 23a of the insulating layer 23 from the one end 27a of the via 27. This flange portion 9 covers a portion enclosing the one end 27a of the via 27 out of the first wiring layer 24.

The first plating layer 8 is covered with the second plating layer 10. The flange portion 11 of this second plating layer 10 is laminated on the flange portion 9 of the first plating layer 8. Therefore, the first and third wiring layers 24 and 26 of the laminate 22 are electrically connected through the first and second plating layers 8 and 10.

Next, the procedure of a method of manufacturing the multilayer printed wiring board 21 of the above configuration will be described below with reference to FIGS. 14 to 21.

Figure 15:
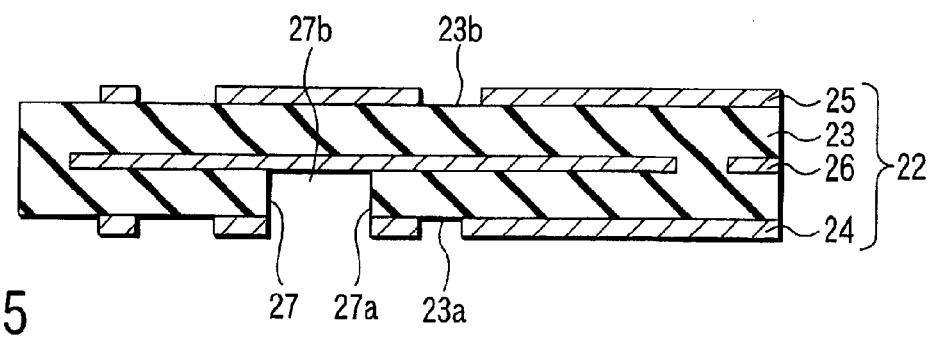
FIG. 15 is a sectional view of a laminate on which an via is formed in the third embodiment of the present invention.

First, the laminate 22 is formed using a build-up method. Next, the via 27 as shown in FIG. 15 is formed by applying the laser processing to the laminate 22. A laser used for the laser processing is irradiated on a portion other the first wiring layer 24 out of the first surface 23a of the insulating layer 23 and scraps off along the direction of the thickness of the insulating layer 23. This laser irradiation is stopped at the time when the other end 27b of the via 27 reaches the third wiring layer 26 inside of the insulating layer 23, thereby making the rear surface of the third wiring layer 26 exposed to the inside of the via 27.

Figure 16:
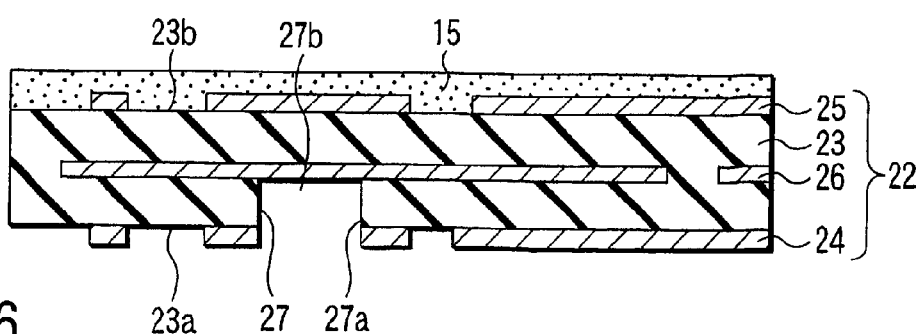
FIG. 16 is a sectional view of a laminate showing a state where an electroless plating resist is coated on the second surface of the insulating layer in the third embodiment of the present invention.

Next, as shown in FIG. 16, the electroless plating resist 15 (first plating resist) is coated on the second surface 23b of the insulating layer 23. The electroless plating resist 15 covers the second surface 23b of the insulating layer 23 and the second wiring layer 25 formed on the second surface 23b.

Figure 17:
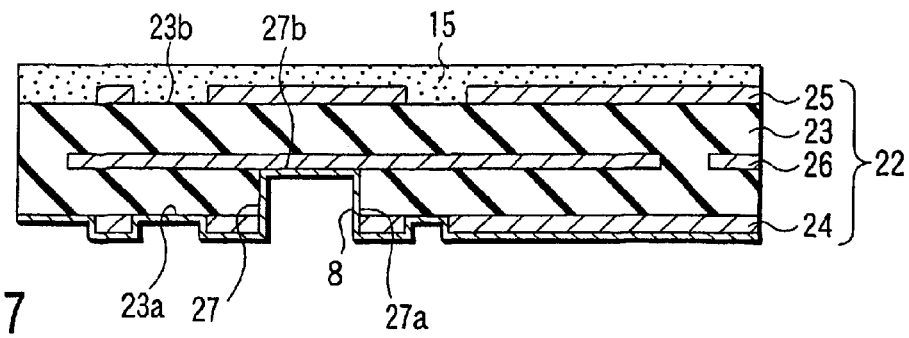
FIG. 17 is a sectional view of a laminate showing a state where the first plating layer is formed on the first surface of an insulating layer and the inner surface of a via in the third embodiment of the present invention.

Next, an electroless plating is applied on the laminate 22. By doing so, the first plating layer 8 as shown in FIG. 17 is continuously formed on a portion exposed without being covered with the electroless plating resist 15 out of the laminate 22, concretely, on the first surface 23a of the insulating layer 23 having the first wiring layer 24, the inner surface of the via 27 and the rear surface of the third wiring layer 26 exposed within the via 27.

Figure 18:
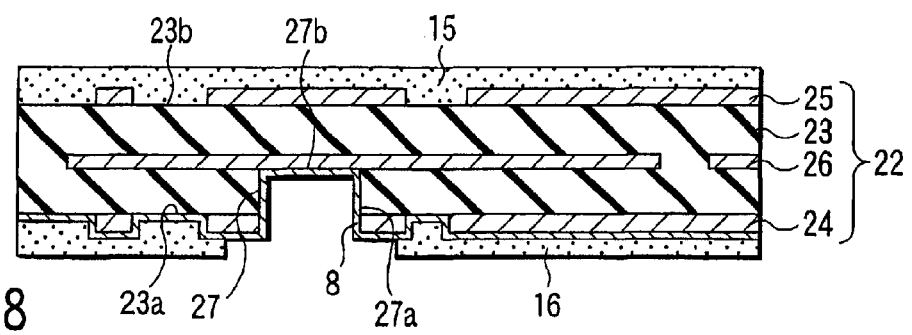
FIG. 18 is a sectional view of a laminate showing a state where an electrolytic plating resist is coated on the first plating layer in the third embodiment of the present invention.

Next, the electrolytic plating resist (second plating resist) 16 is coated on a region other than a portion enclosing the one end 27a of the via 27 out of the first surface 23a of the insulating layer 23 covered with the first plating layer 8 as shown in FIG. 18. As a result, only the first plating layer 8 positioned so as to enclose the inner surface of the via 27 and the one end 27a of the via 27 is maintained in a state of being exposed to the outside of the laminate 22.

Figure 19:
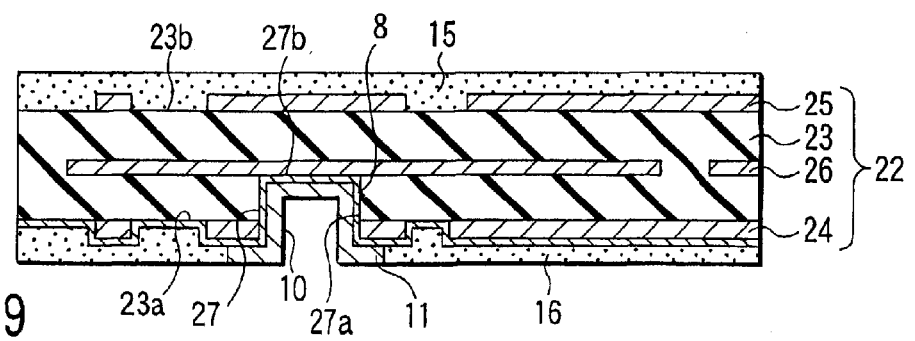
FIG. 19 is a sectional view of a laminate showing a state where the second plating layer is laminated on the first plating layer in the third embodiment of the present invention.

Next, an electrolytic plating is applied on the laminate 22. By doing so, as seen in FIG. 19, the second plating layer 10 is laminated on a portion covering the inner surface of the via 27 where the electrolytic plating resist 16 does not exist out of the first plating layer 8. Moreover, a portion enclosing the one end 27a of the via 27 out of the first plating layer 8 is exposed to the outside without being covered with the electrolytic plating resist 16. Therefore, the second plating layer 10 is also continuously adhered here, this portion functions as the flange portion 11 superimposing on the first wiring layer 23.

Figure 20:
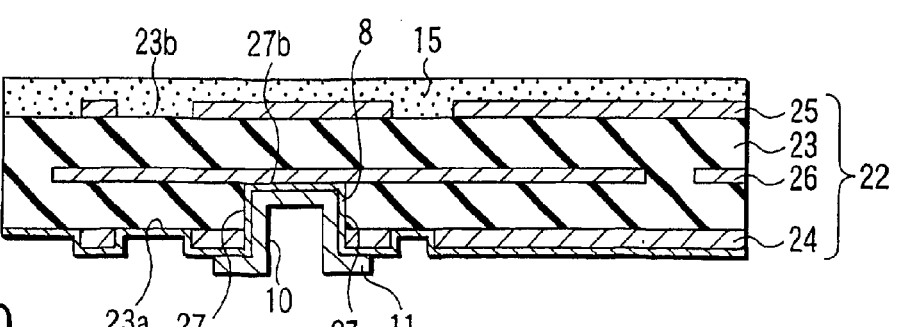
FIG. 20 is a sectional view of a laminate showing a state where an electrolytic plating resist is removed in the third embodiment of the present invention.

Next, as seen in FIGS. 20 and 21, the electroless plating resist 15 of the second surface 23b of the insulating layer 23 is removed as well as the electroless plating resist 16 of the second surface 23a of the insulating 23 is removed. By doing so, the second surface 25 and the first wiring layer 24 covered with the first plating layer 8 are exposed.

Finally, an etching is lightly carried out on the laminate 22, and only the first plating layer 8 formed on the first wiring layer 24 is removed.

According to such a multilayer printed wiring board 21, at the time when an electroless plating and an electrolytic plating are applied on a portion of the via 27, the second surface 23b of the insulating layer 23 is covered with the electroless plating resist 15. Therefore, the first and second plating layers 8 and 10 are not doubly adhered to the second wiring layer 25 formed on the second surface 23b of the insulating layer 23.

Moreover, at the time when an electrolytic plating is subsequently carried out on a portion of the via 27 following the electroless plating, the first surface 23a of the insulating layer 23 is covered with the electrolytic plating resist 16. Therefore, after the electroless plating resist 15 and the electrolytic plating resist 16 are removed from the laminate 22, the first plating layer 8 formed on the first surface 23a can be easily removed only by applying an etching on the laminate 22. Therefore, it is not considered that the first plating layer 8 remains adhered to the first wiring layer 24.

Therefore, the first and second wiring layers 24 and 25 can be made thinner, and a pitch and a pattern width of the first and second wiring layers 24 and 25 can be made to be finer.

Moreover, FIGS. 22 to 27 show the fourth embodiment of the present invention.

As to this fourth embodiment, the present invention is applied to a flexible printed wiring board 31, its fundamental manufacturing steps are similar to those of the first embodiment hard printed wiring board 1 according to the first embodiment.

First, a laminate 30 is prepared. The laminate 30 comprises an insulating layer 32 made of a flexible resin film, and rolled copper foils 35a and 35b. The insulating layer 32 has a first surface 32a and a second surface 32b located on the opposite side of the first surface 32a. The one rolled copper foil 35a is laminated on the first surface 32a of the insulating layer 32, and the other rolled copper foil 35b is laminated on the second surface 32b of the insulating layer 32.

When the laminate 30 is cut into the size corresponding to the printed wiring board 31, an etching is applied on the rolled copper foils 35a and 35b. By doing so, as shown in FIG. 22, the wiring layers 33 and 34 are formed on the first and second surfaces 32a and 32b.

Next, as shown in FIG. 23, a via 37 is formed by applying a laser processing to the laminate 30. A laser used for the laser processing is irradiated on a portion other than the wiring layer 33 out of the first surface 32a of the insulating layer 32, scraps off the insulating layer 32 along the direction of the thickness thereof. This laser irradiation is stopped at the time when the other end 37b of the via 37 reaches the wiring layer 34 of the second surface 32b of the insulating layer 32. As a result, the rear surface of the wiring layer 34 is exposed within the via 37, and the one end 37a of the via 37 is opened on the first surface 32a of the insulating layer 32.

Next, as shown in FIG. 24, a plating resist 38 is coated on the first and second surfaces 32a and 32b of the insulating layer 32, respectively. The plating resist 38 entirely covers the second surface 32b of the insulating layer 32 and the wiring layer 34 on the second surface 32b, and further covers a region other than a portion enclosing the one end 37a of the via 37 out of the first surface 32a together with the wiring layer 33.

Figure 25:
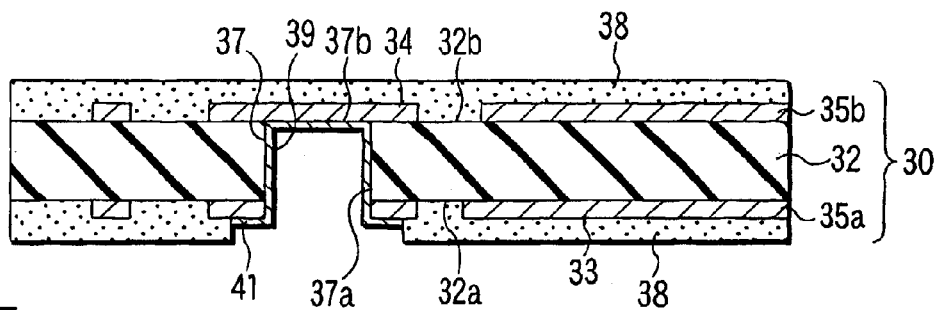
FIG. 25 is a sectional view of a copper clad laminate showing a state where the first plating layer is formed on the inner surface of a via in the fourth embodiment of the present invention.

Next, an electroless plating is applied on the laminate 30 covered with the plating resist 38. By doing so, the first plating layer 39 as shown in FIG. 25 is continuously formed at a portion exposed to the outside without being covered with the plating resist 38, concretely, on the inner surface of the via 37 and the rear surface of the wiring layer 34 exposed within the via 37. The first plating layer 39 functions as a conductive substrate.

Moreover, a portion enclosing the one end 37a of the via 37 out of the first surface 32a of the insulating layer 32 is exposed to the outside without being covered with the plating resist 38. Therefore, the first plating layer 39 also continuously adheres here, and this portion functions as a flange portion 41 covering a portion ranging to the one end 37a of the via 37 out of the wiring layer 33.

Figure 26:
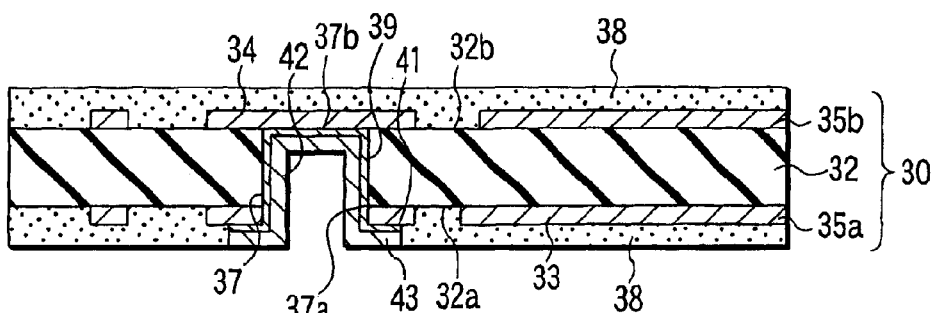
FIG. 26 is a sectional view of a copper clad laminate showing a state where the second plating layer is laminated on the first plating layer in the fourth embodiment of the present invention.

Subsequently, the electrolytic plating is applied on the laminate 30 covered with the plating resist 38. By doing so, as shown in FIG. 26, a second plating layer 42 is laminated on the first plating layer 39. The second plating layer 42 has a flange portion 43 extending to the wiring layer 33 adjacent to the via 37. The flange portion 43 is laminated on the flange portion 41 of the first plating layer 39.

Figure 27:
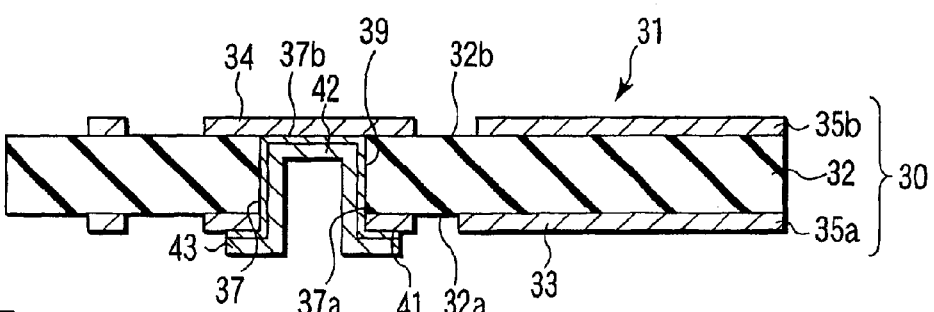
FIG. 27 is a sectional view of a copper clad laminate showing a state where a plating resist is removed and a wiring layer is exposed in the fourth embodiment of the present invention.

Finally, the plating resist 38 is removed from the laminate 30 and the wiring layers 33 and 34 are exposed as shown in FIG. 27. By passing a series of steps, the first and second plating layers 39 and 42 are formed so as to enclose the inner surface of the via 37 and the one end 37a of the via 37 and the flexible printed wiring board 31 to which the wiring layers 33 and 34 are electrically connected through the plating layers 39 and 42 is obtained.

Thus, according to the fourth embodiment, at the time when an electroless plating or an electrolytic plating is applied on the via 37, the wiring layers 33 and 34 are covered with the plating resist 38. Therefore, the excess plating is not adhered to the rolled copper foils 35a and 35b configuring the wiring layers 33 and 34, and these wiring layers 33 and 34 can be made thinner. Hence, a pitch and a pattern width of the wiring layers 33 and 34 can be made to be finer thereby realizing the higher density of the wiring layers 33 and 34.

In addition, the rolled copper foils 35a and 35b which are to be the wiring layers 33 and 34 are excellent in flexibility, and are hard to break. Therefore, in the case where the wiring layers 33 and 34 are directly exposed without being covered with the first and second plating layers 39 and 42, even if bending force is repeatedly added to the flexible wiring board 31, or even if these are used as bent in a U shape, breaks of the wiring layers 33 and 34 can be prevented. Therefore, there is an advantage such that the reliability of the electrical connection is enhanced as well as the life of the flexible wiring board 31 becomes longer.

Figure 28:
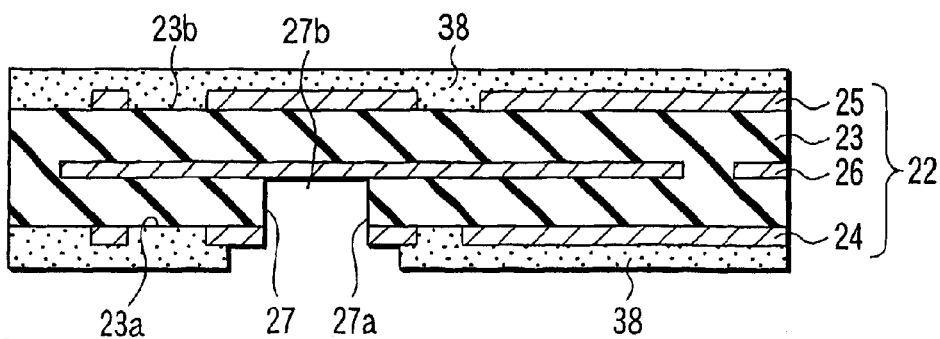
FIG. 28 is a sectional view of a copper clad laminate showing a state where a plating resist covering a wiring layer is coated on the first and second surfaces of the insulating layer in a fifth embodiment of the present invention.
Figure 29:
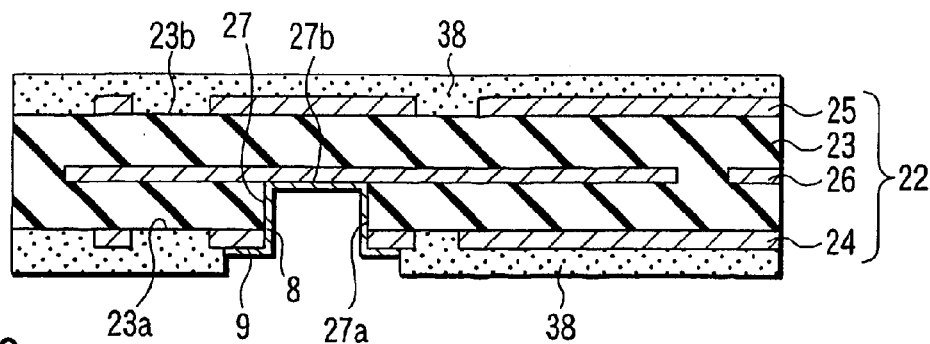
FIG. 29 is a sectional view of a laminate showing a state where the first plating layer is formed on the inner surface of a via in the fifth embodiment of the present invention.
Figure 30:
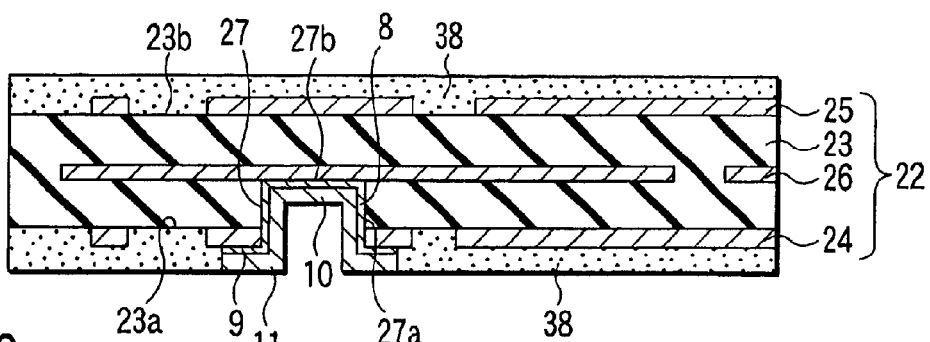
FIG. 30 is a sectional view of a laminate showing a state where the second plating layer is laminated on the first plating layer in the fifth embodiment of the present invention.

FIGS. 28 to 30 show the fifth embodiment of the present invention.

In the fifth embodiment, the manufacturing method used in the fourth embodiment is applied to the multilayer printed wiring board 21 as shown in the third embodiment. In this fifth embodiment, the manufacturing steps after the via 27 has been formed on the laminate 22 are different from the steps of the third embodiment.

When the via 27 is formed on the laminate 22, the plating resist 38 is coated on the first and second surfaces 23a and 23b of the insulating layer 23 as shown in FIG. 28, respectively. The plating resist 38 covers a region other than a portion enclosing the one end 27a of the via 27 out of the first surface 23a together with the first wiring layer 24 as well as entirely covers the second surface 23b of the insulating layer 23 and the second wiring layer 25 formed on the second surface 23b.

Next, an electroless plating is applied on the laminate 22 covered with the plating resist 38. By doing so, the first plating layer 8 as shown in FIG. 29 is continuously formed at a portion exposed to the outside without being covered with the plating resist 38 out of the laminate 22, concretely, on the inner surface of the via 27 and the rear surface of the wiring layer 26 exposed within the via 27.

Moreover, a portion enclosing the one end 27a of the via 27 out of the first surface 23a of the insulating layer 23 is exposed to the outside without being covered with the plating resist 38. Therefore, the first plating layer 8 also continuously adheres here, and this portion functions as the flange portion 9 covering a portion ranging to the one end 27a of the via 27 out of the first wiring layer 24.

Subsequently, the electrolytic plating is applied on the laminate 22 covered with the plating resist 38. By doing so, as seen in FIG. 30, the second plating layer 10 is laminated on the first plating layer 8. The second plating layer 10 has the flange portion 11 extending to the first wiring layer 24 adjacent to the one end 27a of the via 27. This flange portion 11 is laminated on the flange portion 9 of the first plating layer 8. Finally, the plating resist 38 is removed from the laminate 22, and the first and second wiring layers 24 and 25 are exposed.

Thus, according to the fifth embodiment, at the time when an electroless plating or an electrolytic plating is applied on the via 27, the first wiring layer 24 and the second wiring layer 25 are covered with the plating resist 38. Therefore, the excess plating is not adhered to the first and second wiring layers 24 and 25, and these wiring layers 24 and 25 can be made thinner. Hence, a pitch and a pattern width of the first and second wiring layers 24 and 25 can be made to be finer and that the density of the first and second wiring layers 24 and 25 is enhanced to be higher can be realized.

Moreover, FIGS. 31 to 35 show the sixth embodiment of the present invention.

A printed wiring board 51 shown in this sixth embodiment is similar to the printed wiring board 1 shown in the first embodiment, its configuration and manufacturing steps are basically similar to those of the printed wiring board 1 of the first embodiment. In this sixth embodiment, the same reference numerals are attached to the identical constituents with those of the first embodiment and description thereof will be omitted.

Figure 31:
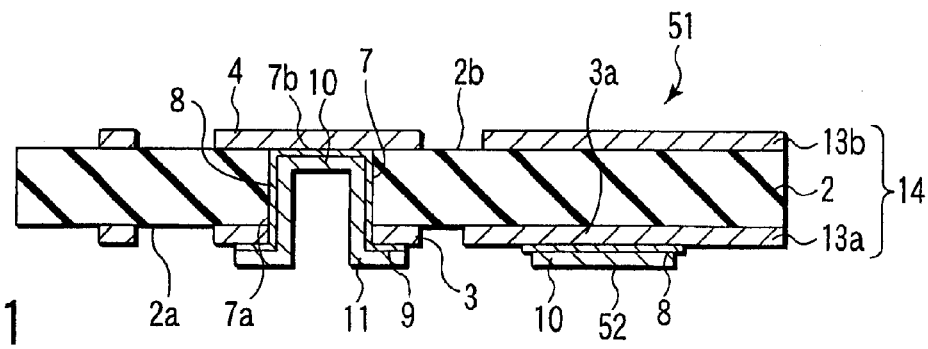
FIG. 31 is a sectional view of a printed wiring board according to a sixth embodiment of the present invention.

As shown in FIG. 31, the printed wiring board 51 has a thick portion 52 whose thickness is increased at a specific portion 3a of the wiring layer 3. The thick portion 52 is constituted by laminating the first and second plating layers 8 and 10 on the copper foil 13a, and the current capacity flowing at the specific portion 3a of the wiring layer 3 is increased due to the plating layers 8 and 10.

The printed wiring board 51 having such a configuration is manufactured according to the steps as described below.

In this step, the procedure from the step in which the via 7 is formed on the insulating layer 2 to the step in which the inner surface of the via 7 is covered with the first plating layer 8 is similar to that of the first embodiment. Therefore, in the sixth embodiment, the steps after the first plating layer 8 has been formed on the inner surface of the via 7 will be described below.

Figure 32:
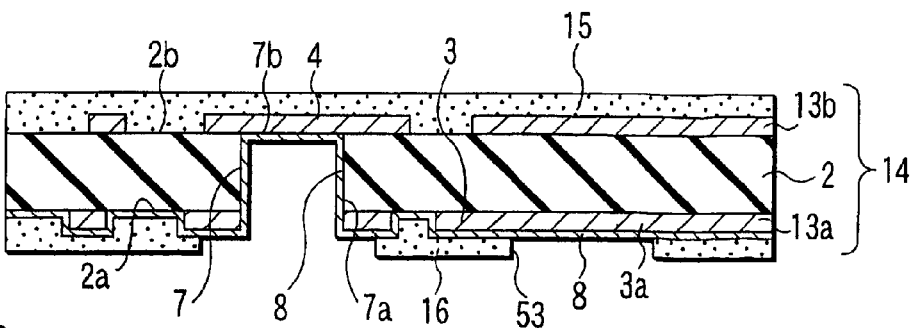
FIG. 32 is a sectional view of a copper clad laminate showing a state where an electrolytic plating resist covering a plating layer is coated on the first surface of an insulating layer in the sixth embodiment of the present invention.

As shown in FIG. 32, a region other than a portion enclosing the one end 7a of the via 7 out of the first surface 2a of the insulating layer 2 covered with the first plating layer 8 is coated with the electrolytic plating resist 16. Next, a slit 53 is formed at a portion corresponding to the specific portion 3a of the wiring layer 3 out of the electrolytic plating resist 16. The slit 53 is opened on the first plating layer 8. As a result, out of the first plating layer 8, the inner surface of the via 7, a portion positioned on the periphery of the one end 7a and a portion corresponding to the specific portion 3a on the wiring layer 3 are maintained in a state where these are exposed to the outside of the copper clad laminate 14.

Figure 33:
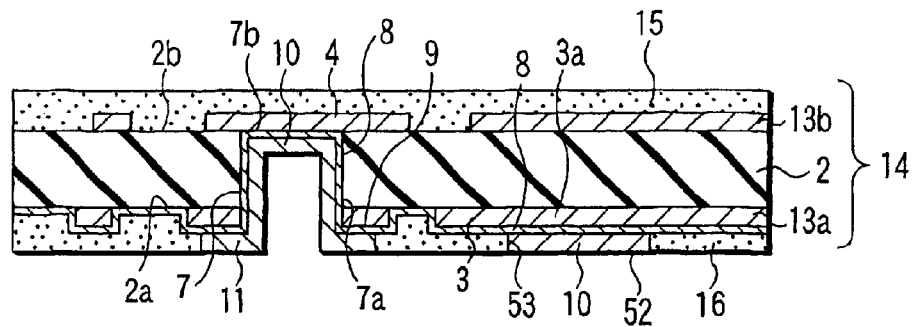
FIG. 33 is a sectional view of a copper clad laminate showing a state where the second plating layer is laminated on the first plating layer in the sixth embodiment of the present invention.

Subsequently, an electrolytic plating is applied on the copper clad laminate 14. By doing so, as seen in FIG. 33, the second plating layer 10 is laminated on a portion corresponding to the specific portion 3a of the wiring layer 3 out of the first plating layer 8. Therefore, in the specific portion 3a of the wiring layer 3, the first and second plating layers 8 and 10 laminated on the copper foil 13a functions as the thick portion 52. The thickness of the thick portion 52 is equal to the total thickness of the flange portions 9 and 11.

Figure 34:
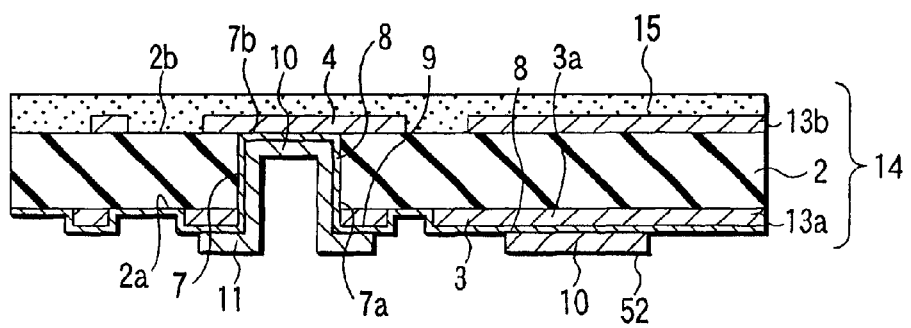
FIG. 34 is a sectional view of a copper clad laminate showing a state where an electrolytic resist is removed and a wiring layer having a thick portion is exposed in the sixth embodiment of the present invention.
Figure 35:
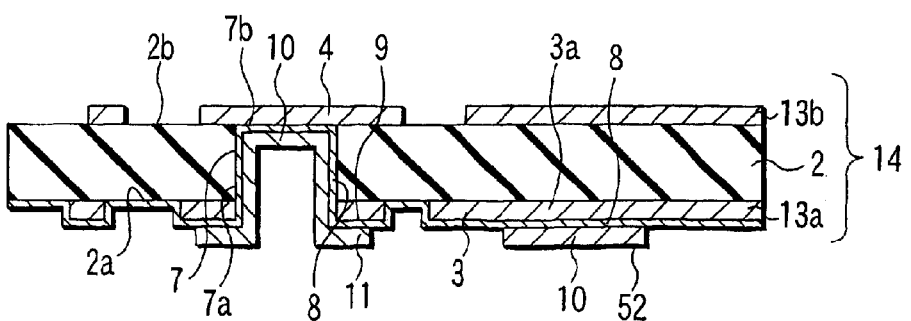
FIG. 35 is a sectional view of a copper clad laminate showing a state where an electroless plating resist is removed and a wiring layer of the second surface is exposed in the sixth embodiment of the present invention.

Next, as shown in FIGS. 34 and 35, the electroless plating resist 15 of the second surface 2b of the insulating layer 2 is removed as well as the electrolytic plating resist 16 of the first surface 2a of the insulating layer 2 is removed. By doing so, the wiring layers 3 and 4 are exposed. Then, finally, an etching is carried out on the copper clad laminate 14, and only the first plating layer 8 formed on the wiring layer 3 is removed. By doing so, the printed wiring board 51 having the thick portion 52 at the specific portion 3a of the wiring layer 3 is obtained.

Thus, according to the sixth embodiment, by setting the thick portion 52 at the specific portion 3a of the wiring layer 3, the current capacity of the wiring layer 3 can be increased without increasing the pattern width of the wiring layer 3. Therefore, even in the case where a large amount of current flows through the wiring layer 3, the wiring layer 3 can be made finer, and this wiring layer 3 can be easily arranged between the other wiring layers.

Furthermore, the resistance value of the wiring layer 3 can be reduced in correspondence to that the current capacity of the wiring layer 3 is increased. Therefore, heat generation of the wiring layer 3 during conducting and change of color in the insulating layer 2 or the like due to this heat generation can be prevented.

Moreover, according to the above method, the thickness of the wiring layer 3 can be increased only by applying the processing to the electrolytic plating resist 16. Therefore, the printed wiring board 51 having the thick portion 52 at the specific portion 3a of the wiring layer 3 can be easily obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A printed wiring board, comprising:

an insulating layer having a first surface, and a second surface located on an opposite side of said first surface;

first to third circuit patterns arranged apart from one another on said first surface, said first to third circuit patterns being formed by etching metal foil deposited on said first surface, said metal foil being plated after the etching, wherein said first circuit pattern is a line through which an electric currently flows;

a plurality of fourth circuit patterns formed on said second surface, said fourth circuit patterns being formed by etching metal foil deposited on said second surface, said metal foil being plated after the etching;

a via formed on said insulating layer, said via having one end opened on said first surface of said insulating layer and surrounded by said second circuit pattern on said first surface, and another end closed by a circuit pattern of said plurality of fourth circuit patterns formed on said second surface of said insulating layer;

a first plating layer having (1) a first portion that covers an inner surface of said via and a circuit pattern of said fourth circuit patterns that closes said another end of said via and which is exposed within said via, (2) a second portion covering a part of said second circuit pattern on said first surface, said second portion surrounding said one end of said via and connected to said first portion, and (3) a third portion that covers a part of said first circuit pattern formed on said first surface such that the first circuit pattern has a part covered by the third portion and a part exposed on the first surface, wherein the first to third portions are simultaneously processed; and a second plating layer laminated on said first plating layer and electrically connecting said second circuit pattern formed on said first surface with said circuit pattern of the plurality of said fourth circuit patterns that closes said another end of said via, wherein a part of the second plating layer that covers the third portion forms a thick portion in cooperation with the third portion, said thick portion having an increased thickness on a part of said first circuit pattern formed on said first surface and being shorter than said first circuit pattern, wherein a current capacity in said first circuit pattern is increased in said thick portion.

2. The printed wiring board according to claim 1, wherein said first plating layer is a groundwork on which said second plating layer is formed, and gives conductivity to the inner surface of said via.

3. The printed wiring board of claim 1, wherein the second plating layer comprises a flange portion laminated on said second portion of said first plating layer.

* * * * *